Dec. 24, 1968 R. W. FRANCE ET AL 3,418,544

ATTACHMENT OF LEADS TO SEMICONDUCTOR DEVICES

Filed July 26, 1966

WITNESSES

Theodore F. Wrobel

James F. Young

INVENTORS
Robert W. France
and Ronald P. Nandor
BY
C. L. Menzemer
ATTORNEY

United States Patent Office 3,418,544
Patented Dec. 24, 1968

3,418,544
ATTACHMENT OF LEADS TO SEMICONDUCTOR DEVICES
Robert W. France, Penn Township, Pittsburgh, and Ronald P. Nandor, Belle Vernon, Pa., assignors to Westinghouse Electric Corporation, Pittsburgh, Pa., a corporation of Pennsylvania
Filed July 26, 1966, Ser. No. 567,920
10 Claims. (Cl. 317—234)

This invention relates to the art of attaching electrical leads to a semiconductor device, and more particularly to the art of attaching leads to closely-spaced metallic conducting regions on a semiconductor wafer so as to provide a shunt connection between the two.

While not limited thereto, the present invention is particularly adapted for use in high gain power transistors of the type wherein doped concentric gold rings are alloyed on one face of a silicon wafer. Such a construction is used, for example, to provide two separate transistor electron valves on a single wafer in a Darlington compound connection wherein the collectors of the two separate transistors are tied directly together and the emitter of the input transistor connected directly to the base of the output transistor. With this arrangement, the emitter current of the input tansistor is equal to the base current of the output tansistor, resulting in a very high current gain.

In order to effect the aforesaid connections between the two transistors, it is necessary to affix electrical leads to adjacent ones of the concentric gold rings such that the leads span the gap between the rings. These leads are used for connection to an external circuit, and also serve as shunt connections between adjacent rings. One gold ring may be doped with boron, for example, while the next successive ring may be doped with bismuth. These rings are initially placed on a silicon wafer and the assembly prefused to form alternate P and N regions on one face of the wafer.

In the past, the electrical leads connected to the gold rings have usually taken the form of flat silver ribbons having a width sufficient to bridge the gap between successive rings. In order to attach these silver ribbons to the gold rings, it has been the practice to attempt to hold each ribbon in engagement with two adjacent rings by means of an external fixture. At this point in the process, the gold rings have formed a gold-silicon eutectic by virtue of the prefusion step; and this eutectic has a melting point of about 380° C. to 400° C., far below the melting point of the silver ribbon. By heating the assembly to a temperature of about 380° C. to 400° C., the eutectic melts or becomes wetted to provide a bond between the ribbons and the rings when the assembly cools down.

Very high rejection rates have resulted for transistor devices manufactured in accordance with the foregoing technique. First, the proper placement of the silver ribbons prior to heating of the assembly is a costly and time-consuming process and requires a relatively high degree of operator skill. Possibly more important, however, is the fact that due to different dopant elements in adjacent rings, one ring will melt before the other. The silver ribbon, being in pressure contact with the rings, will therefore become cocked, often resulting in a faulty connection.

As an overall object, the present invention provides a new and improved method for attaching leads to a semiconductor device, which method overcomes the above and other disadvantages of prior art techniques of this type.

Another object of the invention is to provide a method for attaching leads to concentric, closely-spaced metallic rings on the surface of a silicon wafer such that the leads bridge the gap between successive pairs of rings.

Another object of the invention is to provide a method for attaching leads to closely-spaced metallic regions on a semiconductor device wherein the skill required of the operator is minimized.

Still another object of the invention is to provide a new and improved semiconductor assembly, and particularly a lead attachment for a semiconductor assembly.

In accordance with the invention, lead wires, preferably formed from silver and having lower head portions of sufficient width to span the gap between adjacent metallic electrode regions on a semiconductor wafer, are initially placed in cooperating holes provided in a locating fixture. A semiconductor wafer having closely-spaced metallic electrode regions on its upper surface is then located beneath the fixture and the fixture positioned such that the holes in the fixture and the wires carried therein are directly over gaps between adjacent metallic electrode regions on the wafer with the lower head portions on the wires bridging said gaps. The process is completed by heating the thus assembled parts to braze the head portions to the spaced electrode regions.

In one embodiment of the invention, the lower head portions on the wires simply comprise flattened ends on the silver wires. In another embodiment, each wire has a molybdenum tip brazed to its lower end, which tip has a coefficient of expansion closely matching that of the silicon to lessen the possibility of cracking of the brittle silicon during cooling.

As will be seen, the foregoing procedure greatly simplifies the fabrication of Darlington-type transistors and the like and materially reduces the rejection rate of such transistors manufactured in accordance with the teachings of the invention.

The above and other objects and features of the invention will become apparent from the following detailed description taken in connection with the accompanying drawings which form a part of this specification, and in which.

Figures 1, 2, 3, 4, 5:
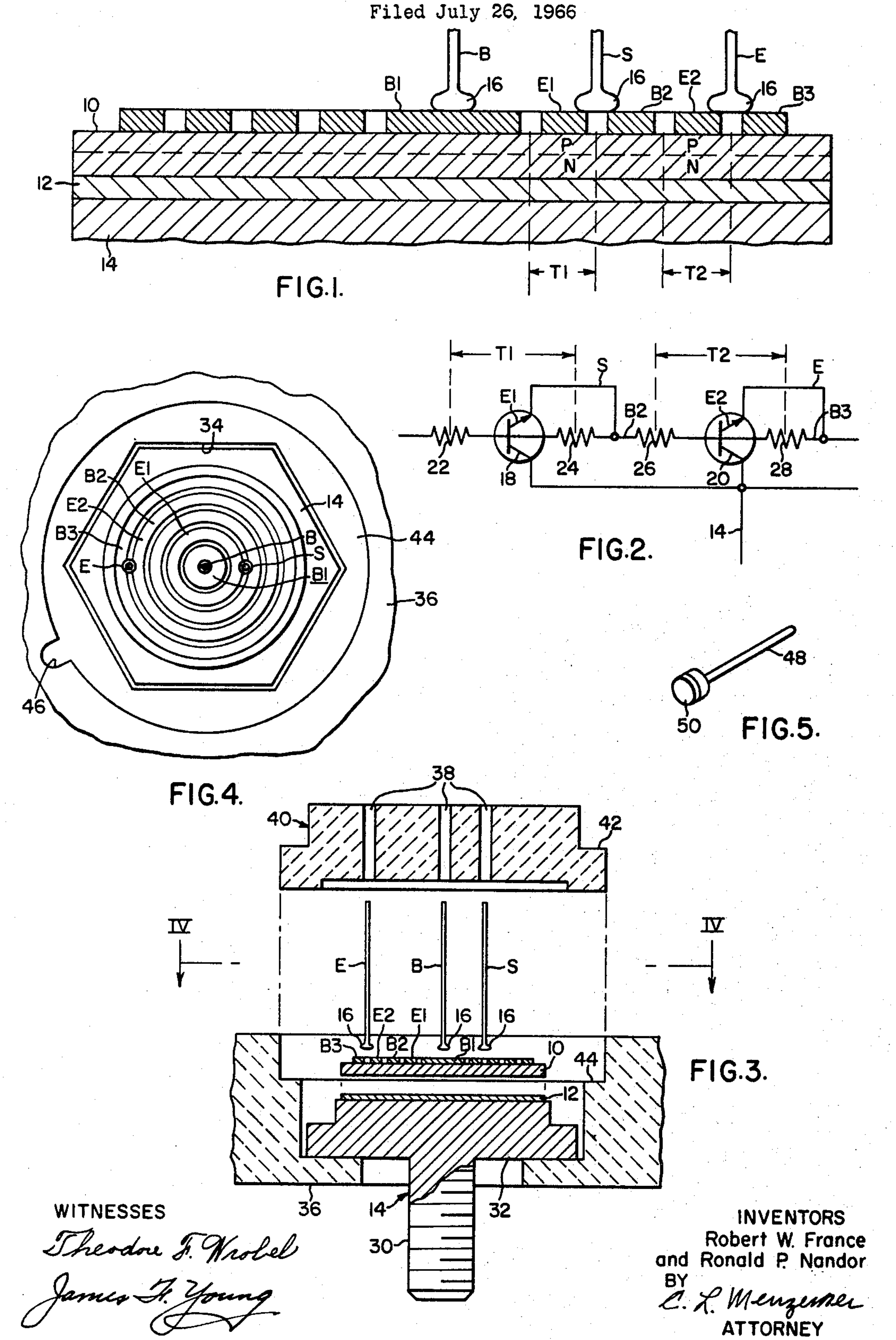
FIGURE 1 is a cross-sectional view of a high gain silicon power transistor of the type wherein concentric rings of conductive material are fused to one surface of a silicon wafer.
FIG. 2 is a schematic circuit diagram of the equivalent circuit for the transistor construction of FIG. 1.
FIG. 3 is a cross-sectional view illustrating the method of the invention for attaching silver leads to concentric gold rings on one surface of a silicon wafer.
FIG. 4 is a cross-sectional view taken along line IV—IV of FIG. 3.
FIG. 5 is an illustration of an alternative form of lead wire which can be used in the invention and incorporating a molybdenum tip on the wire which is affixed to the gold rings on the silicon wafer.

With reference now to the drawings, and particularly to FIG. 1, a cascade transistor power amplifier device is shown incorporating a Darlington compound connection. It comprises a silicon disc 10 having fused to its bottom surface a gold-plated molybdenum disc 12. The molybdenum disc 12, in turn, is silver-soldered to a copper heat sink 14. Above the silicon disc 10 are a base dot B1, comprising a small circle of gold foil, and four concentric gold foil rings identified as E1, B2, E2 and B3. In an actual transistor, the rings may be only on the order of about $\frac{1}{32}$ inch wide and the spacing between adjacent rings much less than that.

In the manufacture of the device of FIG. 1, the starting material is a wafer 10 of P-type silicon. The bottom surface of the P-type wafer 10 is covered with thin gold foil containing an N-type dopant element such as bismuth or antimony. The base dot B1 and the two base rings B2 and B3 are doped with a P-type impurity such that when they are subsequently alloyed to the silicon wafer 10, they provide ohmic contacts to the silicon. The P-type dopant element may, for example, comprise boron. The two emitter rings E1 and E2, however, are doped with an N-type impurity such as bismuth or antimony to form base-emitter junctions. When the aforesaid doped gold foil is placed on the bottom of the wafer 10 and the rings and base dot B1 placed on its upper surface, the assembly is prefused at a temperature of about 700° C., whereby the gold foil on the bottom of the wafer and the rings and base dot on the top are alloyed to the silicon. In this process, the N-type impurities and the lower gold layer diffuse into the silicon and form a lower N-type silicon layer below an upper P-type silicon layer. The dashed lines designated as T1 and T2 are fictitious boundaries which identify the regions of the thus formed input and output transistors, respectively.

In order to effect a Darlington connection, the gold rings E1 and B2 must be shorted or interconnected. Similarly, the rings E2 and B3 must be interconnected. For this purpose, and in accordance with the present invention, silver leads or wires S and E are employed. Each lead S and E has a flattened head portion 16 of sufficient diameter to bridge the gap between adjacent ones of the concentric rings. In order to complete the Darlington connection, a third lead B, also having a flattened head 16, must be connected to the base dot B1.

After the gold rings and the base dot B1 have been prefused to the silicon wafer 10 and the aforesaid gold foil fused to its bottom surface, the leads B, S and E must be attached. At the same time, the wafer 10 must be attached to the gold-plated molybdenum disc 12 which was previously silver-soldered to the copper heat sink 14. For this purpose, the disc 10 is placed over the gold-plated molybdenum disc 12 and the leads B, S and E held in the positions shown by a suitable fixture, hereinafter described in detail. During the prefusion process described above, the gold rings and the base dot B1 formed a eutectic with the silicon. This gold-silicon eutectic has a melting point in the range of about 375° C. to 400° C., far below that of the silver leads B, S and E. Consequently, once the parts shown in FIG. 1 are held in the positions shown, the assembly is heated to a temperature in the range of about 375° C. to 400° C., whereupon the gold rings and the base dot B1 will melt or become wetted such that the silver leads B, S and E are effectively brazed thereto upon cooling. At the same time, the gold plating on the molybdenum disc 12 brazes disc 12 to the silicon disc 10.

The equivalent circuit for the transistor assembly shown in FIG. 1 is illustrated in FIG. 2 and is obtained by replacing the T1 and T2 areas with equivalent NPN transistors 18 and 20. Resistors 22, 24, 26 and 28 represent the resistance of the silicon in the base region. It will be noted that the collectors of the two transistors 18 and 20 are interconnected and, in effect, correspond to the copper heat sink 14. The emitter of the first transistor 18, corresponding to the ring E1 in FIG. 1, is connected through lead S to the ring B2 comprising the base of the second transistor 20. The emitter of the second transistor 20, corresponding to the ring E2 is, in turn, connected through lead E to the ring B3. Ring B3, in turn, is connected through silicon wafer 10 to the emitter 14 as well as to ring B2. Thus, the transistor assembly of FIG. 1 provides a configuration wherein there are, in effect, two essentially separate transistors having their collectors tied together and the emitter of the input transistor 18 connected directly to the base of the output transistor 20 to provide very high current gain.

As was mentioned above, it has been the practice in the past to provide the leads B, S and E in the form of thin silver ribbons having a thickness sufficient to bridge the gap between adjacent ones of the concentric gold rings E1, E2, B2 and B3. These ribbons are normally bent into a V-shape and then positioned to bridge the gap between successive rings. However, since ring E1, for example, is doped differently than ring B2, the one ring will usually melt at a slightly lower temperature than the other, notwithstanding the fact that both are effectively gold-silicon eutectic compositions. This difference in melting temperatures, for example, may be on the order of about 5° C. When an attempt was made to hold the silver ribbon down into engagement with the two rings E1 and B2, for example, the initial melting of one of the rings while the other was still solid would cause the silver ribbon to become cocked. Upon cooling, the resulting induced strains would often cause cracking of the brittle silicon adjacent the connection. While other factors may have contributed to the insufficiency of silver ribbons as leads, the fact remains that semiconductor devices attempting to utilize such leads had a high rejection rate, and it was necessary to scrap many of them.

Apparatus for affixing the leads to the gold rings is shown in FIGS. 3 and 4. The copper heat sink 14 incorporates a threaded stud 30 and comprises the collector of the device as mentioned above. On the upper surface of the copper heat sink 14 is the gold-plated molybdenum disc 12 which was previously silver-soldered to the heat sink 14. As shown in FIG. 4, the heat sink 14 has a flanged hexagon portion 32 which is inserted into a cooperating hexagonal cavity 34 formed in a graphite boat 36 which holds the parts in assembled relationship during attachment of the leads to the gold rings.

Above the molybdenum disc 12 is the prefused silicon disc 10 having the gold rings E1, E2 and B2, B3 previously alloyed to the silicon disc 10 along with the base dot B1. This prefused assembly is placed over the gold-plated molybdenum disc 12. The silver leads E, B and S, having flattened heads 16, are initially inserted into cooperating holes 38 of a precision made graphite fixture 40. This fixture, with the leads E, B and S in the holes 38, is then placed over the disc 10 with the base dot and concentric gold rings thereon such that a flange 42 rests on a shoulder 44 formed in the graphite boat 36. Preferably, the fixture 40 is provided with a tab, not shown, on flange 42 which fits into a cooperating slot 46 (FIG. 4) in the graphite boat 36. This indexes the fixture 40 with respect to the disc 10 and insures that the leads will be properly positioned so as to be directly over the base dot B1 or positioned to span the gap between the leads E2 and B3 or E1 and B2. No pressure is exerted on the leads during heating, their weight being sufficient to effect a brazed bond to the gold rings.

In FIG. 5, another embodiment of the lead is shown wherein the lower tip of the silver wire 48 has brazed onto its one end a molybdenum tip 50, this tip being that portion of the lead which comes into contact with the gold rings. The advantage of the molybdenum tip is that the coefficient of linear expansion of the molybdenum is more nearly matched with that of silicon. Thus, induced strains of the joint are lessened and cracking of the brittle silicon, adjacent to the connection between the leads and the gold rings is less likely to occur during cooling of the device from the soldering temperature in the range of about 380° C. to 400° C.

Although the invention has been shown in connection with certain specific embodiments, it will be readily apparent to those skilled in the art that various changes in form and arrangement of parts may be made to suit requirements without departing from the spirit and scope of the invention.

We claim as our invention:

1. In the method for attaching electrical leads to closely-spaced metallic electrode regions fused to a semiconductive wafer such that each lead is connected to both of a pair of adjacent metallic regions and bridges the gap therebetween; the steps of placing straight wire members in holes provided in a locating fixture, the wires being formed from electrical conducting material and having lower head portions of sufficient area to bridge said gaps between the metallic regions, locating said semiconductive wafer such that it is beneath said fixture with the spaced metallic electrode regions on the upper surface of the wafer, positioning said fixture over the wafer such that said holes and the wires carried therein are directly over the gaps between adjacent metallic electrode regions on the wafer with the lower head portions on the wires bridging said gaps, and heating the thus assembled parts to braze the head portions to the spaced metallic electrode regions.

2. The method of claim 1 wherein said wires are formed from silver and said lower head portions comprise flattened areas integrally formed on an end of each of the silver wires.

3. The method of claim 1 wherein each wire comprises a strand of silver having a molybdenum tip brazed to one end thereof, the molybdenum tip forming said head portion which is brazed to said spaced metallic electrode regions.

4. The method of claim 1 wherein said spaced metallic electrode regions comprise concentric rings of gold, alternate ones of said rings being doped with an impurity of one conductivity type, and the remaining alternate ones of the concentric rings being doped with an impurity of the other conductivity type.

5. The method of claim 1 including the step of placing said wafer on a gold-plated molybdenum disc while it is beneath said fixture such that the molybdenum disc will become brazed to the lower surface of the silicon wafer upon heating of the assembled parts.

6. The method of claim 5 wherein the molybdenum disc is brazed to a copper heat sink having a threaded stud portion, the heat sink resting on a graphite boat having means for receiving and indexing said fixture relative to the wafer whereby the holes in the fixture and the wires carried therein will be above gaps between adjacent metallic electrode regions on the wafer.

7. The method of claim 1 wherein one of two adjacent spaced metallic electrode regions has a lower melting point than the other, and wherein the lower head portions of the wires rest on the metallic electrode regions under the force of gravity only during heating of the assembled parts.

8. A semiconductor assembly comprising a wafer of silicon having fused to one face thereof concentric gold foil rings, alternate ones of said rings being doped with an impurity of one conductivity type and the remaining alternate rings being doped with an impurity of the other conductivity type, and lead wires of generally circular cross section having enlarged cross-sectional lower ends electrically bonded to adjacent ones of said gold foil rings such that the enlarged cross-sectional lower ends bridge the gaps between said adjacent rings, as is produced by maintaining said lower ends of the wires in engagement with adjacent rings and heating the assembly to a temperature slightly above the melting point of the gold-silicon eutectic composition of the rings formed when they are fused to the silicon.

9. The semiconductor assembly of claim 8 wherein the lead wires are formed from silver.

10. The semiconductor assembly of claim 8 wherein each lead wire is formed from a silver strand having a molybdenum disc brazed to its lower end, the molybdenum disc being in contact with said gold rings.

References Cited

UNITED STATES PATENTS 3,210,617 10/1965 Kruper ............ 317—234

JOHN W. HUCKERT, *Primary Examiner.*
R. F. POLISSACK, *Assistant Examiner.*

U.S. Cl. X.R.

29—589; 317—235